United States Patent [19]

Hough

[11] Patent Number: 4,818,859
[45] Date of Patent: Apr. 4, 1989

[54] LOW PROFILE OPTO-DEVICE ASSEMBLY WITH SPECIFIC OPTOELECTRONIC LEAD MOUNT

[75] Inventor: Stewart E. Hough, Georgetown, Tex.

[73] Assignee: Carroll Touch Inc., Round Rock, Tex.

[21] Appl. No.: 57,065

[22] Filed: Jun. 1, 1987

[51] Int. Cl.⁴ .............................................. G01V 9/04
[52] U.S. Cl. .................................... 250/221; 250/239
[58] Field of Search ................... 250/221, 222.1, 239, 250/231, 214 C; 339/17, 125, 210 R; 350/96.20, 96.21; 340/555, 556, 557

[56] References Cited

U.S. PATENT DOCUMENTS

| | | | |
|---|---|---|---|
| 3,335,387 | 8/1967 | Mueller | 339/17 |
| 4,065,198 | 12/1977 | Jordan | 339/17 D |
| 4,241,277 | 12/1980 | Hintze et al. | 250/221 |
| 4,267,443 | 5/1981 | Carroll et al. | 250/221 |
| 4,384,201 | 5/1983 | Carroll et al. | 339/17 D |
| 4,387,367 | 6/1983 | Fisher | 250/221 |
| 4,534,604 | 8/1985 | Peterson | 313/500 |
| 4,547,039 | 10/1985 | Canon et al. | 350/96.2 |
| 4,579,404 | 4/1986 | Lockard | 339/14 R |
| 4,591,710 | 5/1986 | Kompdina et al. | 250/221 |
| 4,672,201 | 6/1987 | Welker | 250/231 SE |
| 4,695,720 | 9/1987 | Rieder et al. | 250/231 SE |
| 4,695,827 | 9/1987 | Beining et al. | 250/221 |

FOREIGN PATENT DOCUMENTS 0079161 5/1983 European Pat. Off. .

Primary Examiner—David C. Nelms
Assistant Examiner—Jessie Ruoff
Attorney, Agent, or Firm—Robert W. Pitts

[57] ABSTRACT

A low profile opto-device panel assembly suitable for use in an input detection apparatus used as an input device in conjunction with a visual display is disclosed. Arrays of light emitting devices and light detecting devices are juxtaposed along the internal edge of a peripheral frame printed circuit board to reduce the overall height of the panel assembly. Alignment housings surrounding each of the arrays of opto-devices are attached to the printed circuit board and extend inwardly of the sides of the peripheral frame printed circuit board. The opto-devices disposed in the alignment housings along the internal edge of the printed circuit boards are mechanically and electrically interconnected to the printed circuit board by bent leads which extend along the upper surface of the printed circuit board and into conventional printed circuit board holes.

13 Claims, 5 Drawing Sheets

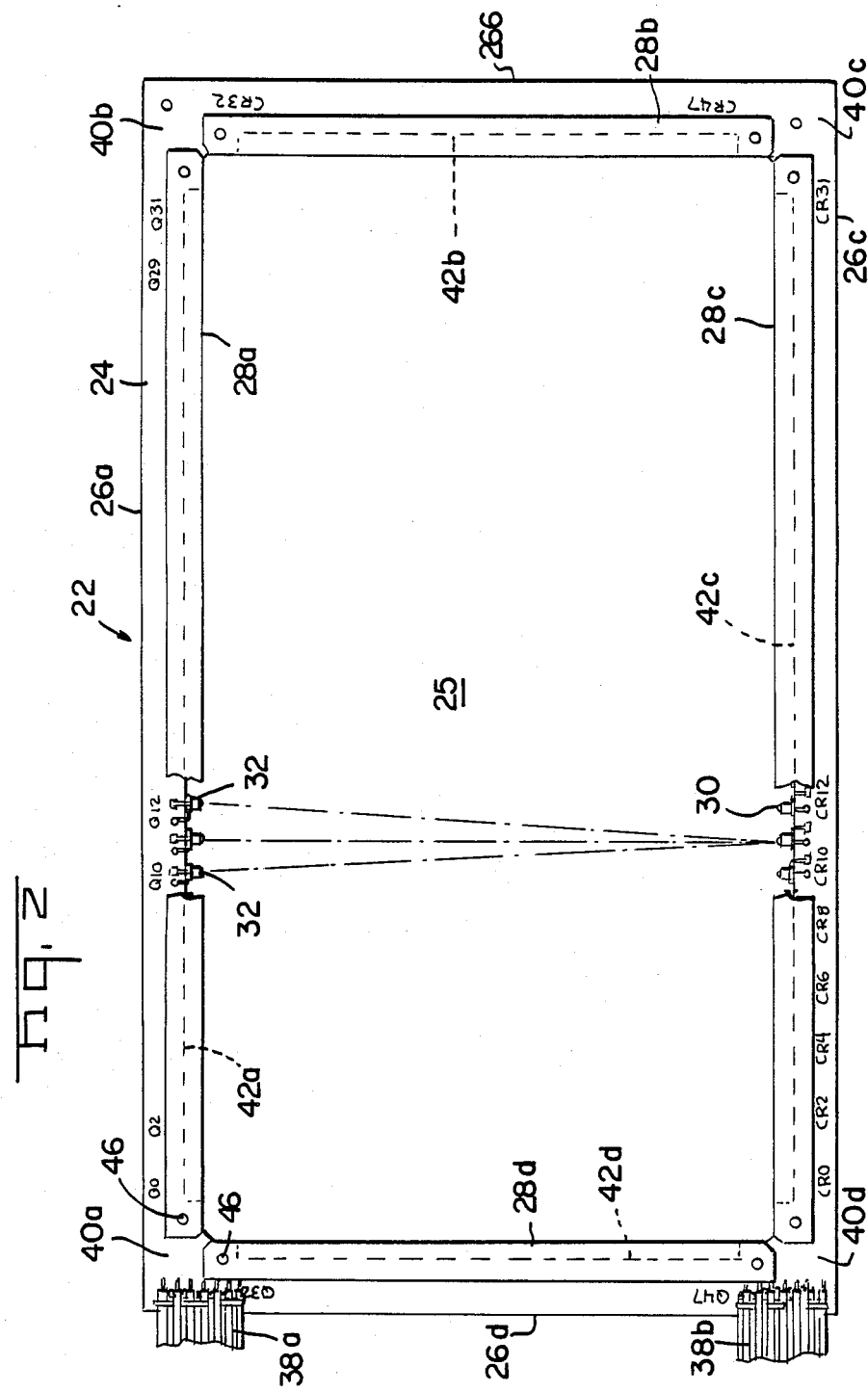

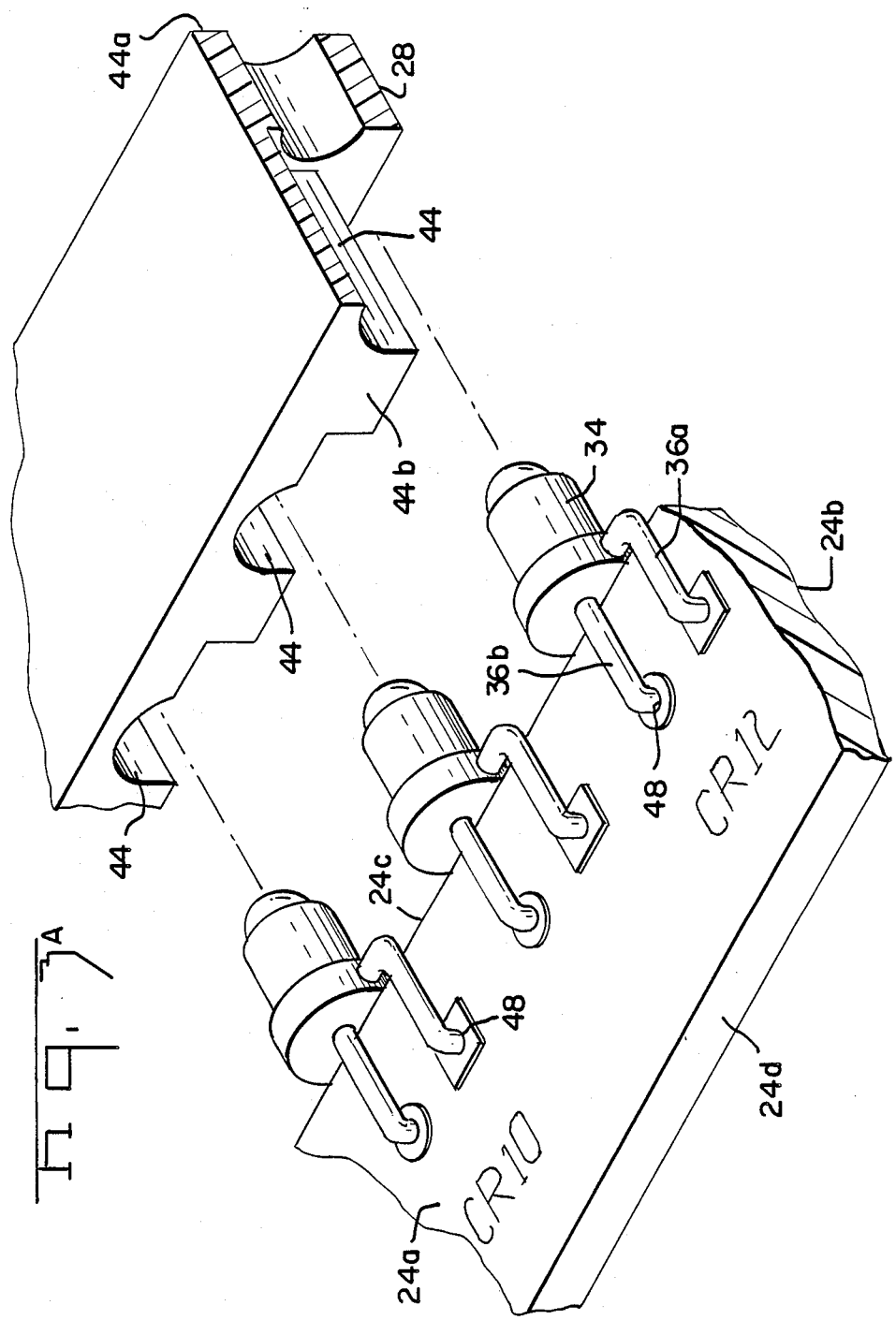

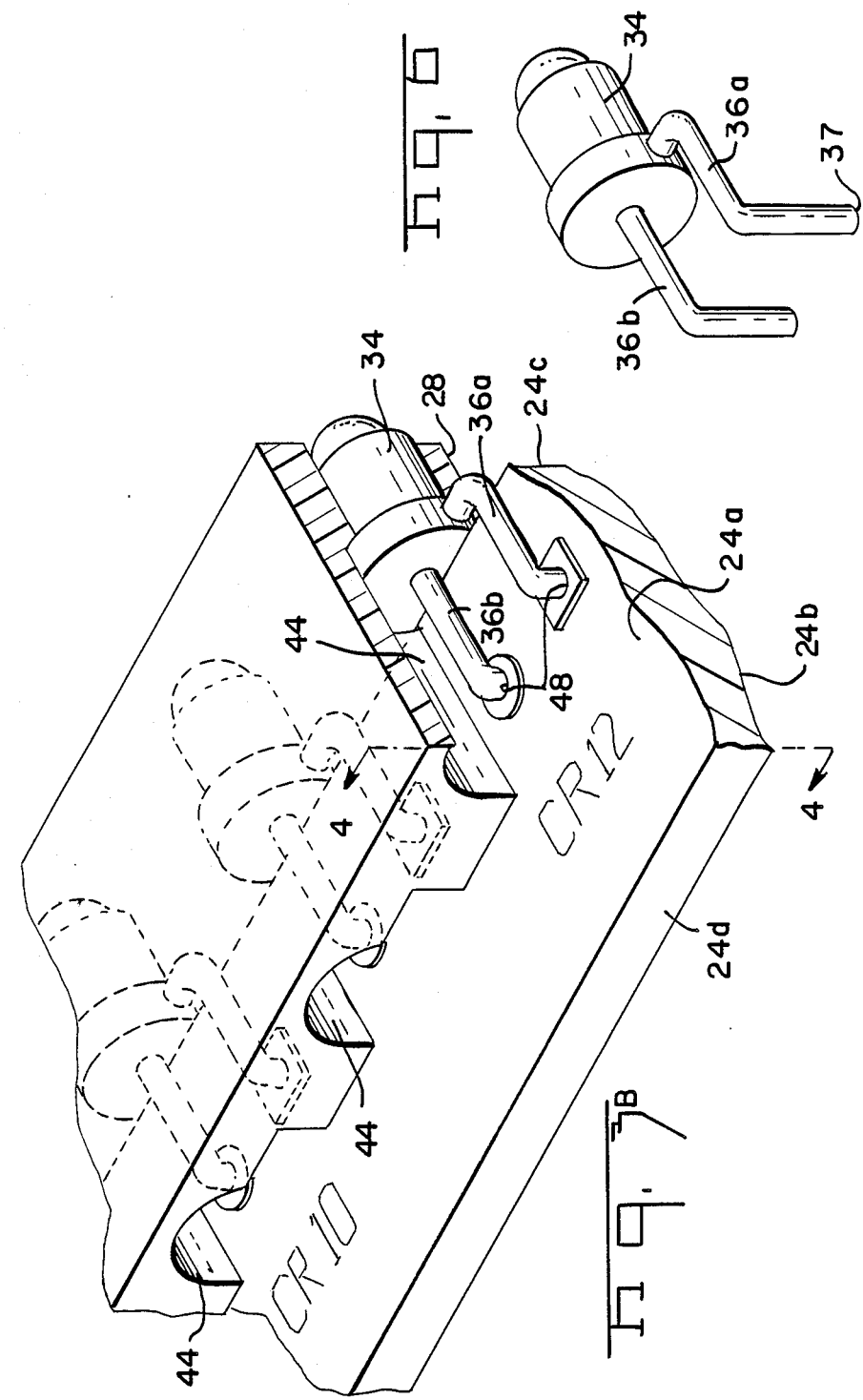

LOW PROFILE OPTO-DEVICE ASSEMBLY WITH SPECIFIC OPTOELECTRONIC LEAD MOUNT

BACKGROUND OF THE INVENTION

1. Field of the Invention

This invention relates to the detection of a member interrupting one or more beams transmitted between an emitter and an associated detector in an irradiated field, and more particularly relates to touch input detection systems for determining the intrusion and the relative position of a stylus within an irradiated field generally adjacent to an electronic display and formed by a plurality of infrared emitter/detector pairs.

2. Description of the Prior Art

Detection systems comprising a plurality of light emitting and detecting pairs located around the periphery of an irradiated field have been employed in a number of applications. For example, infrared detector fields can be used as a safety interlock or an anti-intrusion system for preventing access to a certain area or as a safety barrier around a machine. One ever increasing use of such systems is as a touch input device to an electronic display. For example, an array of infrared light emitters and detectors can be positioned around the periphery of an electronic display such as a CRT or a flat panel display. A number of such systems employ an X-Y matrix of emitters and detectors with associated emitters and detectors being axially aligned in pairs. In such touch entry systems, the introduction of a stylus within the irradiated field in proximity to a portion of the display permits input for controlling the operation of a computer communicating with the electronic display and the touch input apparatus. Conventional infrared or light "type" touch input devices employ opto-devices such as LEDs, photodiodes, and phototransistors. An example of a touch input system utilizing opto matrix frames consisting of infrared emitters and detectors may be found in U.S. Pat. No. 4,267,443, "Photoelectronic Input Apparatus", issued on May 12, 1981.

The arrays of emitters and detectors commonly used in conventional opto matrix touch input systems are normally positioned on a peripheral frame comprising a printed circuit board which has a central opening. The printed circuit board can be positioned within the bezel on a conventional CRT screen with the central opening aligned with the visual display surface. The arrays of emitters and detectors can be arranged in a curved pattern to correspond to the contour of a curved CRT screen or can be positioned within the same plane for use with flat panel displays. In either instance, the opto-devices may be mounted perpendicular to the printed circuit boards. Such an arrangement, however, requires planar members on which the opto-devices are mounted to extend perpendicular to the display surfaces in the manner disclosed in U.S. Pat. No. 4,267,443 and U.S. Pat. No. 4,591,710. This configuration, however, results in a comparatively high profile opto matrix frame, especially for flat panel opto matrix frames. An alternative approach orients the opto matrix devices on brackets mounted on the peripheral printed circuit board frame, with the light emitting devices adapted to emit a beam extending generally parallel to the plane of the flat printed circuit boards. This manner of mounting the opto matrix devices is considered conventional and corresponds to the manner in which individual or a small number of light emitting devices are normally positioned on a printed circuit board. Examples of this conventional mounting technique for discrete light emitting devices are shown in U.S. Pat. No. 3,335,387; U.S. Pat. No. 4,065,198; and U.S. Pat. No. 4,534,604.

SUMMARY OF THE INVENTION

The preferred embodiment of the invention disclosed herein relates to a low profile opto-device panel assembly of the type used to detect the intrusion of an opaque element such as a stylus into an irradiated field which can be formed by a plurality of intersecting infrared beams. The preferred embodiment of this invention is especially adapted for use in detecting inputs to flat panel visual display devices. The opto-device panel assembly which has a central opening can be positioned such that arrays of light emitting devices are aligned with light detecting devices on the periphery of the irradiated field. A peripheral frame consisting of a printed circuit board assembly is used to mount the opto-devices on the periphery of the irradiated visual display field. The preferred embodiment of this invention is characterized in that the profile or height of the entire panel assembly is minimized by positioning the opto-devices along an internal edge of the peripheral frame. The leads of the opto-devices extend from points at which these leads are mechanically and electrically interconnected to circuits on the printed circuit board to the body of the opto-device, which is disposed along the internal edge of the peripheral frame and which extends below the upper surface of the printed circuit board to reduce the height of the opto-device panel assembly.

BRIEF DESCRIPTION OF THE DRAWINGS

FIG. 2 is a view of an opto-device panel assembly employing arrays of emitters and detectors located on a peripheral frame suitable for mounting in surrounding relationship to a visual display.

FIGS. 3A and 3B are perspective views of a plurality of opto-devices mounted along the edge of a printed circuit board and in alignment with the opto-devices.

FIG. 6 is a perspective view of a typical opto-device component suitable for low profile mounting.

DETAILED DESCRIPTION OF THE PREFERRED EMBODIMENT

Figure 1:
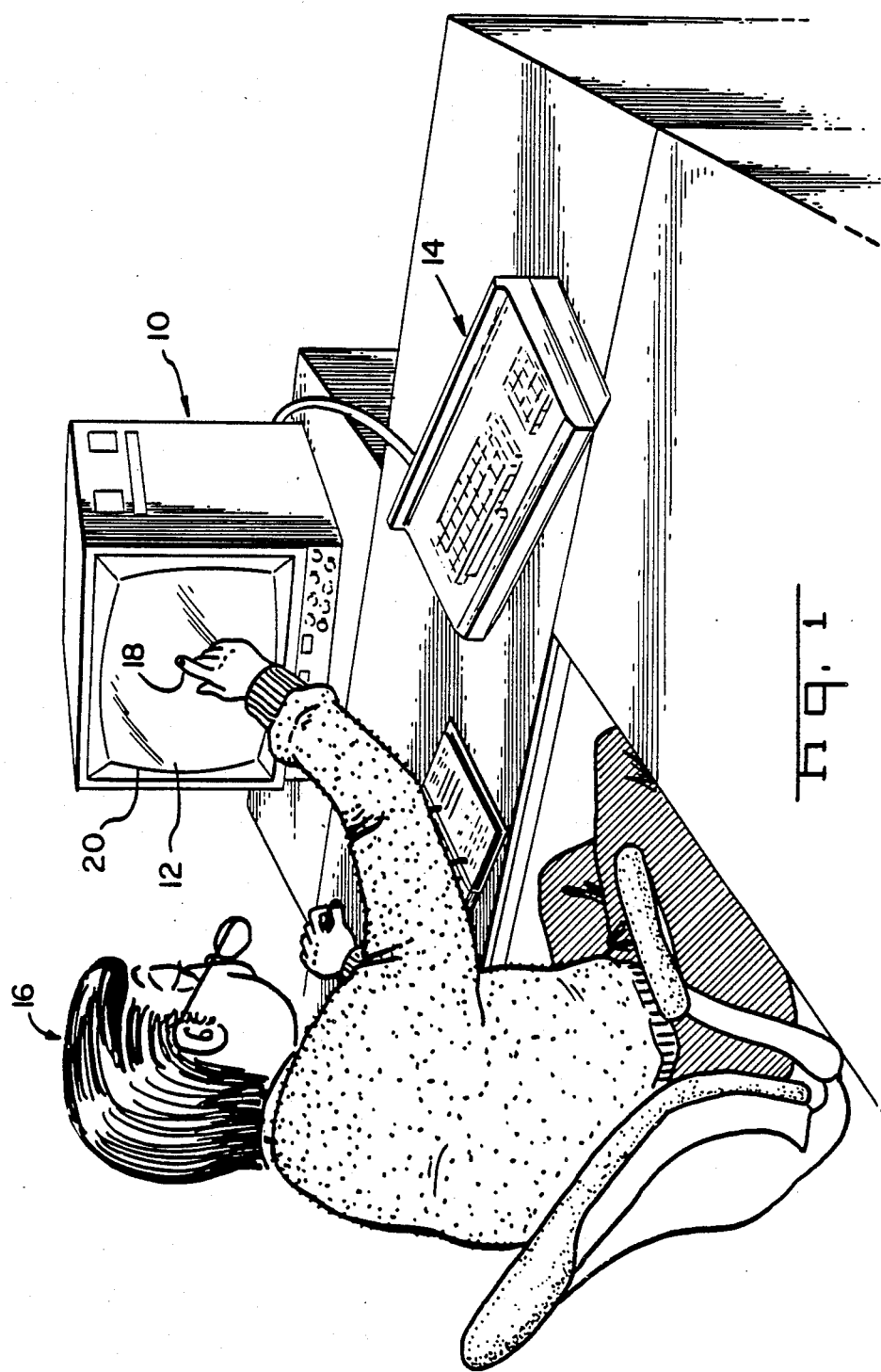
FIG. 1 is a view demonstrating the manner in which a typical user could interact directly with a visual display which employs an opto-device panel assembly to detect the intrusion of a stylus, such as the operator's finger.

The preferred embodiment of this invention is intended for use in communicating through an electronic display which comprises an input and output means for a digital computer. As shown in FIG. 1, the operator 16 can communicate with the display 12 of a CRT 10 by positioning an opaque member 18, such as his finger, in the touch sensitive area. Input to a computer through the display screen 12 is accomplished by use of an opto matrix touch input frame 22 (FIG. 2) which can be positioned between bezel 20 adjacent the video display. The opto matrix frame 22 establishes an irradiated field adjacent the display which permits detection of an intruding stylus, such as the operator's finger 18, into the irradiated field and also determines a precise position relative to the video display. Thus, an operator 16 can simply choose one of several alternative inputs displayed at various locations on a screen, and can perform other interactions with the display 12, such as cursor control. By using infrared emitters and detectors, the beam pattern established within the irradiated field will not optically interfere with the electronic display. A touch input system of this type can be employed either as an alternative to or in addition to a conventional keyboard 14.

FIG. 2 depicts the layout of an opto-device panel assembly 22 which comprises a peripheral frame 24 formed by four interconnected sides 26 surrounding a central opening 25. Arrays of light emitting devices 30, such as infrared LED's, and light detecting devices 32, such as phototransistors, are positioned on the peripheral frame 24 with individual light emitting devices 30 being aligned with corresponding individual phototransistors 32 positioned along an opposite side of the peripheral frame 24. The preferred embodiment of this invention comprises a flat peripheral frame 24, especially suitable for use with flat panel displays. It should be understood, however, that the peripheral frame 24 might be curved to correspond to the curved contour of a CRT screen. The peripheral frame 24 comprises an interconnection substrate, such as a printed circuit board containing a plurality of circuits, not shown, which would be deployed on the printed circuit board in a conventional manner. The individual light emitting devices 30 and light detecting devices 32 are interconnected to suitable circuits on the printed circuit board. The opto-device panel assembly 22 and the individual light emitting devices 30 and light detecting devices 32 are interconnected to a suitable computer by means of input and output cables 38a and 38b. Circuit components, including microprocessors, may be mounted directly to the printed circuit board. The sequence, in which the light emitting devices 30 and the light detecting devices 32 are activated, is controlled by microprocessors and computing means in a conventional manner. As with other conventional infrared touch input devices, individual light emitting devices are activated at the same time as a corresponding light detecting device aligned with the activated light emitting device. Thus, even though light may be incident on light detecting devices 32 which may not be in line with an activated light emitting device 30, only the aligned light emitting device would be responsive at the time the corresponding light emitting device is activated.

The individual light emitting devices 30 and light detecting devices 32 are of conventional construction. Each device has a body 34 with a plurality of leads 36a and 36b extending between the body 34 and free ends 37. As shown in FIG. 6, each lead is bent between the body and the free end 37. These bent leads can then be inserted through holes 48 on a printed circuit board and the leads 37 can be soldered to the printed circuit board to establish a mechanical and electrical connection for each lead to the appropriate circuit. In the preferred embodiment of this invention, the interconnection between the opto-devices and the peripheral frame printed circuit board 24 is thus established by conventional through hole soldering means.

In the preferred embodiment of this invention, the light emitting devices 30 and the light detecting devices 32 are positioned in arrays along separate sides 26 of the peripheral frame printed circuit board 24. In the preferred embodiment of this invention, these light emitting devices or light emitting diodes 30 are located along the lower side 26c and the right side 26b. Arrays of corresponding light detecting devices or phototransistors 32 are arrayed along the top 26a and the left side 26d. Thirty-two separate light emitting devices (CR0-CR31) are located along lower side 26c and sixteen light emitting devices (CR32-CR47) are located along right side 26b. Similarly, thirty-two light detecting devices (Q0-Q31) are located along top side 26a and sixteen light detecting devices (Q32-Q47) are located along the left side 26d. Corresponding light emitting devices and light detecting devices, for example CR8 and Q8, are axially aligned on opposite sides of the central opening 25 within the peripheral frame 24.

Figure 4:
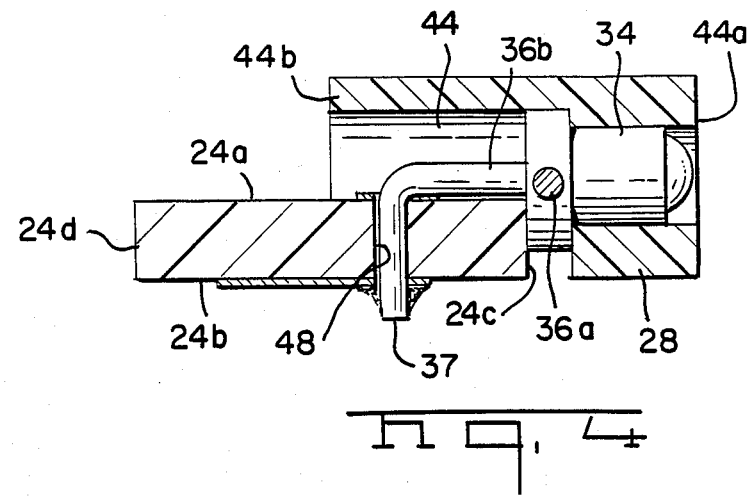
FIG. 4 is a section view showing an opto-device mounted on the edge of a printed circuit board.
Figure 5:
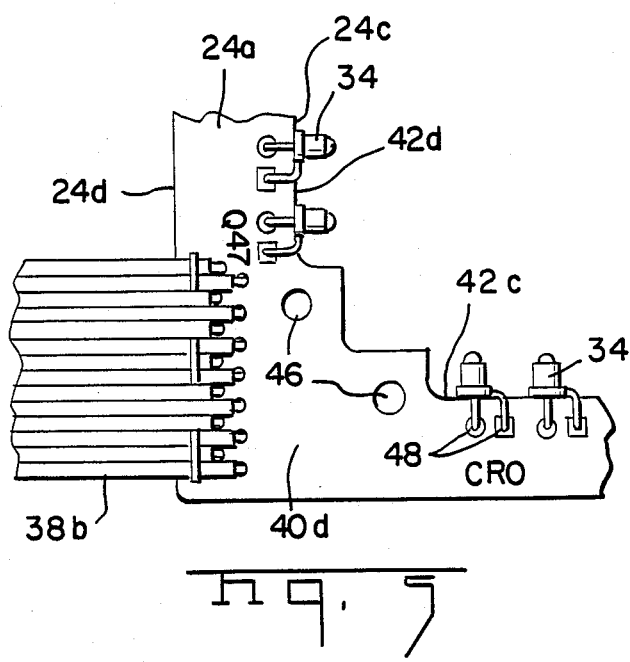
FIG. 5 is a view showing the manner in which an input or output cable is attached to the peripheral printed circuit board frame.

The peripheral frame printed circuit board 24 can comprise a conventional printed circuit board having through hole interconnections 48. The peripheral frame printed circuit board 24 has an upper surface 24a and a lower surface 24b with a first or internal edge 24c extending between upper and lower surfaces and a second or external edge 24d also extending between the upper and lower surfaces of the printed circuit board. Since the peripheral frame 24 extends around the open central area, the first or internal edge 24c always faces inwardly towards the central opening 25. The internal edges 24c along each side 26a, 26b, 26c, 26d, are set back from the internal edge of the printed circuit board at the corners 40a, 40b, 40c, 40d. Recesses 42a, 42b, 42c, 42d are formed along the internal edge of the peripheral frame 24. Each of the light emitting devices 30 and light detecting devices 32 are mounted along the internal edge 24c of the peripheral frame printed circuit board 24 within the recesses 42a, 42b, 42c, 42d. The opto-devices 30 and 32 are juxtaposed to the internal edge of the printed circuit board within each recess 42. At least a portion of the body 34 of each opto-device 30, 32 extends below the upper surface 24a of the peripheral frame printed circuit board 24, as shown in FIG. 4, to reduce the height of the opto-device panel assembly 22.

Linear alignment housing members or opto-device holders 28a, 28b, 28c, 28d are attached to the peripheral frame 24, and the individual opto-devices 30, 32 are retained within open ended cavities within the linear housing members 28a, 28b, 28c, 28d. The housing members serve to align the opto-devices 30, 32. These housing members 28a, 28b, 28c, 28d are attached to the peripheral frame 24 at the corners 40a, 40b, 40c, 40d by conventional means, such as rivets 46. The housing cavities 44 are open along opposite faces 44a, 44b so that the housing can be assembled to the peripheral frame 24 by slipping the housing members 28 over the opto-devices 30, 32 which are thereby inserted into cavities 44. By assembling the devices in this manner, the opto-device bodies 34 are not assembled on top of the peripheral frame printed circuit boards 24 but are instead assembled in juxtaposed relationship at the internal edges 24c. Furthermore, the housing member 28 is not assembled on the upper surface 24a of the printed circuit board. Thus, a much lower profile device can be assembled.

The rectangular frame device depicted herein merely represents the conventional and preferred configuration of this low profile opto-device panel assembly 22. It should be understood that other configurations could be employed. For example, curved rather than flat printed circuit boards might be employed. Circular rather than rectangular configurations might also be suitable. Furthermore, it is not essential that the peripheral frame 24 extend completely around the central opening 25. Although the frame 24 is to be disposed around the periphery of the visual display, it is not essential that the peripheral frame 24 be formed of a single continuous member. Therefore, it should be understood that the invention as set forth in the following claims is not limited to the preferred embodiment depicted herein since alternative configurations would be immediately apparent to one of ordinary skill in the art.

What is claimed:

1. An opto-device assembly comprising: a substrate having an upper surface and a lower surface with opposed first and second peripheral edges extending between the upper and lower surfaces and interconnection means adjacent the first peripheral edge of the substrate; and at least one opto-device having a body and leads extending from the body, the opto-device assembly being characterized in that at least a portion of each lead extends along the upper surface of the substrate between the interconnection means and the first peripheral edge of the substrate, the opto-device body being juxtaposed to the first peripheral edge with at least a portion of the opto-device body extending below the upper surface of the substrate.

2. The opto-device assembly of claim 1 wherein the substrate comprises a printed circuit board.

3. The opto-device assembly of claim 2 wherein a housing member is attached to the printed circuit board and extends from the lower surface of the printed circuit board to a position above the upper surface thereof, the housing member also being juxtaposed to the first peripheral edge of the printed circuit board; each opto-device being positioned within the housing member.

4. The opto-device assembly of claim 3 wherein a plurality of opto-devices are positioned side-by-side along the first peripheral edge of the printed circuit board.

5. The opto-device assembly of claim 4 wherein the first peripheral edge of the printed circuit board has a recess extending along a portion of its length, the opto-devices being positioned within the recess, the housing member being attached to the printed circuit board adjacent the recess.

6. The opto-device assembly of claim 5 wherein the printed circuit board comprises a frame extending at least partially around a central opening, the first peripheral edge of the printed circuit board being adjacent the central opening.

7. The opto-device assembly of claim 6 wherein the frame is rectangular, each side of the rectangular frame having a recess extending between but not to each corner of the rectangular frame; the housing member comprising a plurality of separate linear members.

8. The opto-device assembly of claim 7 wherein each linear member is attached to the printed circuit board adjacent the corners of the printed circuit board.

9. The opto-device assembly of claim 3 wherein the housing member is open between opposite faces.

10. The opto-device assembly of claim 3 wherein the housing includes means for aligning each opto-device relative to the printed circuit board.

11. The opto-device assembly of claim 2 wherein the interconnection means comprises holes in the printed circuit board, the leads of each opto-device being bent intermediate a free end thereof and the opto-device body, the portion of each lead adjacent the free end thereof extending through the holes in the printed circuit board.

12. An opto-device panel assembly for use in an input detection apparatus of the type used to detect the intrusion of an opaque element into an irradiated field, the panel assembly being configured to extend around but not into the irradiated field and comprising:

an array of opto-devices having leads extending from a body, the opto-devices comprising a plurality of light emitting devices aligned with an array of light detecting devices;

a peripheral frame comprising an interconnection substrate, the opto-devices being mounted on the frame with light emitting devices being spaced from aligned light detecting devices, the frame being open between corresponding arrays of light emitting devices and light detecting devices, the substrate having an internal peripheral edge, the opto-device panel being characterized in that the opto-devices are disposed with at least a portion of the leads extending along an upper surface of the substrate to the internal peripheral edge of the substrate and secured to circuits thereon and with the opto-device body being disposed within the internal peripheral edge of the substrate, at least a portion of the body of each opto-device extending below the upper surface of the substrate to reduce the height of the opto-device panel assembly.

13. The opto-device panel assembly of claim 12 wherein the substrate comprises a printed circuit board.

* * * * *